United States Patent
Steiger et al.

(10) Patent No.: US 8,841,164 B2
(45) Date of Patent: Sep. 23, 2014

(54) PROCESS FOR PRODUCING INDIUM OXIDE-CONTAINING LAYERS, INDIUM OXIDE-CONTAINING LAYERS PRODUCED BY THE PROCESS AND USE THEREOF

(75) Inventors: Jürgen Steiger, Düsseldorf (DE); Duy Vu Pham, Oberhausen (DE); Heiko Thiem, Bensheim (DE); Alexey Merkulov, Ludwigshafen (DE); Arne Hoppe, Herne (DE)

(73) Assignee: Evonik Degussa GmbH, Essen (DE)

( * ) Notice: Subject to any disclaimer, the term of this patent is extended or adjusted under 35 U.S.C. 154(b) by 98 days.

(21) Appl. No.: 13/516,900

(22) PCT Filed: Nov. 25, 2010

(86) PCT No.: PCT/EP2010/068185
§ 371 (c)(1),
(2), (4) Date: Aug. 6, 2012

(87) PCT Pub. No.: WO2011/073005
PCT Pub. Date: Jun. 23, 2011

(65) Prior Publication Data
US 2013/0122647 A1 May 16, 2013

(30) Foreign Application Priority Data

Dec. 18, 2009 (DE) .......................... 10 2009 054 997

(51) Int. Cl.
*H01L 21/00* (2006.01)

(52) U.S. Cl.
USPC ................ 438/104; 438/99; 438/609; 257/43

(58) Field of Classification Search
USPC .................. 438/496, 584, 758, 99, 104, 609; 257/E33.06, E31.119, 43, E33.064, 257/E31.126
See application file for complete search history.

(56) References Cited

U.S. PATENT DOCUMENTS

| | | | |
|---|---|---|---|
| 8,137,794 B2 * | 3/2012 | Luethge et al. | 428/195.1 |
| 2008/0233378 A1 | 9/2008 | Luthge et al. | |
| 2010/0132788 A1 | 6/2010 | Petrat et al. | |
| 2011/0014437 A1 | 1/2011 | Luethge et al. | |
| 2011/0193084 A1 | 8/2011 | Thiem et al. | |
| 2011/0309313 A1 | 12/2011 | Steiger et al. | |
| 2011/0315982 A1 | 12/2011 | Hoppe et al. | |
| 2012/0213980 A1 | 8/2012 | Arning et al. | |

FOREIGN PATENT DOCUMENTS

| | | |
|---|---|---|
| DE | 10 2007 013 181 | 9/2008 |
| JP | 1-115010 | 5/1989 |
| JP | 2-113033 | 4/1990 |
| JP | 2000 16812 | 1/2000 |
| JP | 2005-272189 | 10/2005 |
| JP | 2008-500151 | 1/2008 |

OTHER PUBLICATIONS

International Search Report Issued Jul. 5, 2011 in PCT/EP10/68185 Filed Nov. 25, 2010.
U.S. Appl. No. 13/391,114, filed Apr. 27, 2012, Steiger, et al.
U.S. Appl. No. 13/390,840, filed Apr. 5, 2012, Steiger, et al.
U.S. Appl. No. 13/515,007, filed Jun. 11, 2012, Steiger, et al.
U.S. Appl. No. 13/809,322, filed Jan. 9, 2013, Steiger, et al.
U.S. Appl. No. 13/809,423, filed Jan. 10, 2013, Steiger, et al.
U.S. Appl. No. 13/884,495, filed May 9, 2013, Steiger, et al.
Japanese Office Action issued Jun. 2, 2014 in Patent Application No. JP2012-543576.

* cited by examiner

*Primary Examiner* — Jarrett Stark
*Assistant Examiner* — Shahed Ahmed
(74) *Attorney, Agent, or Firm* — Oblon, Spivak, McClelland, Maier & Neustadt, L.L.P.

(57) ABSTRACT

The present invention relates to a liquid phase process for producing indium oxide-containing layers from nonaqueous solution, in which an anhydrous composition containing at least one indium halogen alkoxide of the generic formula $InX(OR)_2$ where R=alkyl radical and/or alkoxyalkyl radical and X=F, Cl, Br or I and at least one solvent or dispersion medium is, in the sequence of points a) to d), in anhydrous atmosphere, a) applied to the substrate, b) the composition applied to the substrate is irradiated with electromagnetic radiation of wavelength $\leq 360$ nm and c) optionally dried, and then d) converted thermally to an indium oxide-containing layer, to the layers producible by the process and to the use thereof.

20 Claims, No Drawings

PROCESS FOR PRODUCING INDIUM OXIDE-CONTAINING LAYERS, INDIUM OXIDE-CONTAINING LAYERS PRODUCED BY THE PROCESS AND USE THEREOF

The present invention relates to a process for producing indium oxide-containing layers, to the indium oxide-containing layers producible by the process according to the invention and to the use thereof.

The production of semiconductive electronic component layers by means of printing and other liquid deposition processes enables a simplification in terms of process technology and much lower production costs compared to many other processes, for example chemical vapour deposition (CVD), since the semiconductor can be deposited here in a continuous operation. Furthermore, at low process temperatures, there is the possibility also of working on flexible substrates, and possibly (in particular in the case of very thin layers and especially in the case of oxidic semiconductors) of achieving optical transparency of the printed layers. Semiconductive layers are understood here and hereinafter to mean layers which have charge carrier mobilities of 0.1 to 50 $cm^2/Vs$ for a component with a channel length of 20 μm at gate-source voltage 50 V and source-drain voltage 50 V.

Since the material of the component layer to be produced by means of printing or other liquid deposition processes crucially determines the particular layer properties, the selection thereof has an important influence on any component containing this component layer. Important parameters for printed semiconductor layers are the particular charge carrier mobilities thereof, and the processibilities and processing temperatures of the printable precursors used in the course of production thereof. The materials should have good charge carrier mobility and be producible from solution and at temperatures significantly below 500° C. in order to be suitable for a multitude of applications and substrates. Likewise desirable for many novel applications is optical transparency of the semiconductive layers obtained.

Owing to the large band gap between 3.6 and 3.75 eV (measured for layers applied by vapour deposition, H. S. Kim, P. D. Byrne, A. Facchetti, T. J. Marks; *J. Am. Chem. Soc.* 2008, 130, 12580-12581), indium oxide (indium(III) oxide, $In_2O_3$) is a promising and therefore widely used semiconductor. Thin films of a few hundred nanometres in thickness may additionally have a high transparency in the visible spectral range of greater than 90% at 550 nm. In extremely highly ordered indium oxide single crystals, it is additionally possible to measure charge carrier mobilities of up to 160 $cm^2/Vs$. To date, however, it has not been possible to achieve such values by processing from solution (H. Nakazawa, Y. Ito, E. Matsumoto, K. Adachi, N. Aoki, Y. Ochiai; *J. Appl. Phys.* 2006, 100, 093706. and A. Gupta, H. Cao, Parekh, K. K. V. Rao, A. R. Raju, U. V. Waghmare; *J. Appl. Phys.* 2007, 101, 09N513).

Indium oxide is often used in particular together with tin (IV) oxide ($SnO_2$) as the semiconductive mixed oxide ITO. Owing to the comparatively high conductivity of ITO layers with simultaneous transparency in the visible spectral region, one use thereof is that in liquid-crystal displays (LCDs), especially as "transparent electrode". These usually doped metal oxide layers are produced industrially in particular by costly vapour deposition methods under high vacuum. Owing to the great economic interest in ITO-coated substrates, there now exist some coating processes, based on sol-gel techniques in particular, for indium oxide-containing layers.

In principle, there are two options for the production of indium oxide semiconductors via printing processes: 1) particle concepts in which (nano)particles are present in printable dispersion and, after the printing operation, are converted to the desired semiconductor layer by sintering operations, and 2) precursor concepts in which at least one soluble or dispersible precursor, after the printing of an appropriate composition, is converted to an indium oxide-containing layer. A precursor is understood to mean a compound which can be decomposed thermally or with electromagnetic radiation, with which metal oxide-containing layers can be formed in the presence or absence of oxygen or other oxidizing agents. The particle concept has two important disadvantages compared to the use of precursors: firstly, the particle dispersions have colloidal instability which necessitates the use of dispersing additives (which are disadvantageous in respect of the later layer properties); secondly, many of the usable particles (for example owing to passivation layers) only incompletely form layers by sintering, such that some particulate structures still occur in the layers. At the particle boundary thereof, there is considerable particle-particle resistance, which reduces the mobility of the charge carriers and increases the general layer resistance.

There are various precursors for the production of indium oxide-containing layers. For example, in addition to indium salts, it is also possible to use indium alkoxides (homoleptic compounds, i.e. those having only indium and alkoxide radicals, especially indium compounds of the $In(OR)_3$ type where R=alkyl or oxyalkyl radical) and indium halogen alkoxides (i.e. indium compounds having both halogen and alkoxide radicals, especially trivalent indium compounds of the $InX_m(OR)_{3-m}$ type where X=halogen, R=alkyl or oxyalkyl radical and m=1, 2) as precursors for the production of indium oxide-containing layers.

For example, Marks et al. describe components which have been produced using a precursor-containing composition comprising the salt $InCl_3$ and the base monoethanolamine (MEA) dissolved in methoxyethanol. After spin-coating of the composition, the corresponding indium oxide layer is obtained by a thermal treatment at 400° C. (H. S. Kim, P. D. Byrne, A. Facchetti, T. J. Marks; *J. Am. Chem. Soc.* 2008, 130, 12580-12581 and supplemental information).

Compared to indium salt-containing compositions, indium alkoxide- or indium halogen alkoxide-containing compositions have the advantage that they can be converted to indium oxide-containing coatings at lower temperatures. In addition, it has been assumed to date that halogenated precursors potentially have the disadvantage of leading to halogenated layers with reduced quality. For this reason, attempts to form layers have been undertaken with indium alkoxides.

Indium alkoxides and indium halogen alkoxides, and the synthesis thereof, have been described since as early as the 1970s.

For example, Carmalt et al. in a review article summarize the data known at this time regarding synthesis, structure and reactivities of, inter alia, indium(III) alkoxides and alkylalkoxides (Carmalt et al., Coord. Chem Rev. 250 (2006), 682-709).

One of the longest-known syntheses of indium alkoxides is described by Chatterjee et al. They describe the preparation of indium trisalkoxide $In(OR)_3$ from indium(III) chloride ($InCl_3$) with sodium alkoxide NaOR where R represents methyl, ethyl, isopropyl, n-, s-, t-butyl and -pentyl radicals (S. Chatterjee, S. R. Bindal, R. C. Mehrotra; *J. Indian Chem. Soc.* 1976, 53, 867).

Bradley et al. report a similar reaction to Chatterjee et al. and obtain, with virtually identical reactants ($InCl_3$, isopropylsodium) and reaction conditions, an indium oxo alkoxide cluster with oxygen as the central atom (D. C. Bradley, H.

Chudzynska, D. M. Frigo, M. E. Hammond, M. B. Hursthouse, M. A. Mazid; *Polyhedron* 1990, 9, 719).

A particularly good variant of this process, which leads to particularly low contamination of chlorine in the product, is described in US 2009-0112012 A1. The efforts to achieve a minimum level of chlorine impurities in the product are attributed to the fact that it has been assumed to date that chlorine impurities contribute to a reduction in the performance or in the lifetime of electronic components (cf., for example, U.S. Pat. No. 6,426,425 B2).

Likewise based on an indium halide but on other bases is the process described in U.S. Pat. No. 5,237,081 A for production of pure indium alkoxides, in which an indium(III) halide is reacted with an alcohol in a basic medium. The base is said to be a strong base with low nucleophilicity. Bases mentioned by way of illustration are, as well as complex cyclic heterocycles mentioned by way of example, tertiary amines.

U.S. Pat. No. 4,681,959 A describes a general two-stage process for preparing metal alkoxides (especially tetraalkoxy compounds such as tetramethyl titanate), in which a halide of an at least divalent metal is reacted with an alcohol, optionally in the presence of an aromatic solvent, first to give an intermediate (a halogen-alkoxy compound of the metal). Subsequently, the intermediate is reacted with an alcohol in the presence of a hydrogen halide acceptor (especially a tertiary amine) to form the metal alkoxide.

Alternative synthesis routes to homoleptic indium alkoxide complexes are described by Seigi Suh et al. in J. Am. Chem. Soc. 2000, 122, 9396-9404. However, the processes described therein are very complex and/or are based on commercially unavailable reactants (which therefore first have to be synthesized in a disadvantageous manner in a preceding step).

A general process for preparing halogen-alkoxy-metal compounds is described in U.S. Pat. No. 4,681,959 A: a two-stage process for preparing metal alkoxides (especially tetraalkoxy compounds such as tetramethyl titanate) is described in general terms therein, in which a halide of an at least divalent metal is reacted with an alcohol—optionally in the presence of an aromatic solvent—first to give an intermediate (a halogen-alkoxy compound of the metal). Hydrogen halide formed in the course thereof is preferably driven out with an inert gas, for example nitrogen.

Indium halogen alkoxides and the synthesis thereof are also described in JP 02-113033 A and JP 02-145459 A. For instance, JP 02-113033 A discloses that chlorinated alkoxides of indium, after dissolution of indium chloride in an alcohol corresponding to the alkoxide radical to be incorporated, can be prepared by subsequent addition of a particular proportion of an alkali metal or of an alkali metal alkoxide. A corresponding process is also described in JP 02-145459 A.

Indium oxide layers can in principle be produced from indium alkoxides and indium halogen alkoxides i) by sol-gel processes in which the precursors used first react in the presence of water, by hydrolysis and subsequent condensation, to give gels and are then converted to metal oxides, or ii) from nonaqueous solution.

The production of indium oxide-containing layers from indium alkoxides via sol-gel processes in the presence of significant amounts of water forms part of the prior art. WO 2008/083310 A1 describes, for example, processes for producing inorganic layers or organic/inorganic hybrid layers on a substrate, in which a metal alkoxide (e.g. one of the generic formula $R^1M(OR^2)_{y-x}$ or a prepolymer thereof is applied to a substrate, and then the resulting metal alkoxide layer is hardened in the reactive presence of water, with supply of heat. The metal alkoxides usable may include an indium alkoxide.

JP 01-115010 A addresses a thermal conversion in a sol-gel process. This document describes compositions for transparent conductive thin layers, which have a long pot life and are not hydrolysed as a composition, and which comprise chlorinated indium alkoxides of the formula $(OR)_xCl_{3-x}$. After application to a substrate, gelation of the alkoxide on the substrate as a result of the water content in air, and subsequent drying at up to 200° C., these compositions can be converted at temperatures of 400-600° C.

JP 02-113033 A describes processes for applying an antistatic coating to a non-metallic material, in which the non-metallic material is coated with a composition comprising a chlorinated indium alkoxide, and the composition is gelated under air and then calcined.

JP 09-157855 A describes a sol-gel process for producing a metal oxide layer, in which a metal oxide sol which consists of a metal alkoxide or a metal salt (e.g. an indium alkoxide or salt) and has been produced by hydrolysis is applied to the surface of a substrate, optionally at a temperature at which the gel is yet to crystallize, dried and irradiated with UV radiation at less than 360 nm.

JP 2000-016812 A also describes a process for production of a metal oxide layer via a sol-gel process. In this process, the substrate is coated with a coating composition of a metal oxide sol composed of a metal salt or metal alkoxide, especially an $In_2O_3$—$SnO_2$ composition, and irradiated and heat-treated with UV radiation of wavelength less than 360 nm.

JP 59-198606 A describes compositions for formation of transparent electrically conductive layers which comprise $InCl_x(OR)_{3-x}$ and an organic solvent and have a water content of 0.1-10% based on the organic solvent. This composition therefore comprises a sol of an indium halogen alkoxide. To form the transparent conductive layer, the composition is applied to a substrate and dried at typically 150° C., then fired at temperatures of preferably 300° C.

However, a disadvantage of the use of sol-gel processes is that the hydrolysis-condensation reaction is automatically started in the presence of water and can be controlled only with difficulty after it has started. If the hydrolysis-condensation process is already started before application to the substrate, as, for example, in the case of JP 09-157855 A, JP 2000-016812 A and JP 59-198606 A, the gels obtained in the meantime are often unsuitable for processes for obtaining fine oxide layers owing to their elevated viscosity. When the hydrolysis-condensation process, as in the case of WO 2008/083310 A1, JP 01-115010 A or JP 02-113033 A, in contrast, is started only after application to the substrate by supply of water in liquid form or as steam, the poorly mixed and inhomogeneous gels that are the result often lead to correspondingly inhomogeneous layers with disadvantageous properties.

For this reason, anhydrous precursor-based processes for production of indium oxide-containing layers are of interest, i.e. processes which do not proceed via a sol-gel operation.

For instance, JP 2007-042689 A describes metal alkoxide solutions which may contain indium alkoxides, and processes for production of semiconductor components which use these metal alkoxide solutions. The metal alkoxide films are treated thermally and converted to the oxide layer.

JP 02-145459 A describes indium halogen alkoxide-containing coating compositions which are not hydrolysed in the course of storage and which can be converted by calcination to an indium oxide-containing layer.

JP 59-198607 A describes processes for production of transparent conductive layers which may have a protective film composed of various resins. The transparent conductive layer may be an indium oxide-containing layer, and can be produced via a liquid phase process, in which a corresponding composition is applied to a substrate, dried and converted thermally. According to the examples, an $InCl(OC_3H_7)_2$-containing composition can be used.

JP 11-106935 A describes a process for producing an oxide-based transparent conductive film in which, inter alia, an anhydrous composition comprising an alkoxide of a metal (e.g. indium) is applied to a substrate and heated. The film can also subsequently be converted using UV or VIS radiation to a metal oxide-based thin layer.

However, the processes known to date for anhydrous production of indium oxide-containing layers also have disadvantages: a conversion performed purely by thermal means has the disadvantage that it cannot produce fine structures and that it is also unable to precisely control the resulting layer properties.

Conversions which proceed exclusively via radiation also have the disadvantage that they require very high energy densities over a prolonged period and as such are very complex in apparatus terms. Moreover, all anhydrous processes available to date for production of indium oxide-containing layers have the disadvantage that the resulting layers do not have sufficiently good electrical properties, more particularly field-effect mobilities $\mu_{FET}$.

It is thus an object of the present invention to provide a process for production of indium oxide-containing layers, which avoids the known disadvantages of the prior art and which, more particularly, is also suitable for production of fine structures, does not require high energy densities over a prolonged period, is less complex in apparatus terms and leads to layers with better electrical properties, especially field-effect mobilities.

This objective is achieved in accordance with the invention by a liquid phase process for producing indium oxide-containing layers from nonaqueous solution according to claim 1, in which an anhydrous composition containing at least one indium halogen alkoxide of the generic formula $InX(OR)_2$ where R=alkyl radical and/or alkoxyalkyl radical and X=F, Cl, Br or I and at least one solvent or dispersion medium is, in the sequence of points a) to d), in anhydrous atmosphere, a) applied to a substrate,
b) the composition applied to the substrate is irradiated with electromagnetic radiation of wavelength ≤360 nm and
c) optionally dried, and then
d) converted thermally to an indium oxide-containing layer.

The liquid phase process according to the invention for production of indium oxide-containing layers from nonaqueous solution is a process comprising at least one process step in which the substrate to be coated is coated with a liquid nonaqueous solution containing at least one indium halogen alkoxide, irradiated with electromagnetic radiation, optionally dried and then thermally converted. More particularly, this operation is not a sputtering, CVD or sol-gel operation. Liquid compositions in the context of the present invention are understood to mean those which are in liquid form under SATP conditions ("Standard Ambient Temperature and Pressure"; T=25° C. and p=1013 hPa) and on application to the substrate to be coated. A nonaqueous solution or an anhydrous composition is understood here and hereinafter to mean a solution or formulation having not more than 500 ppm of $H_2O$.

To achieve particularly good results, the process according to the invention can more preferably also be performed in an anhydrous atmosphere, i.e. in an atmosphere with a water content of not more than 500 ppm.

The process product of the process according to the invention, the indium oxide-containing layer, is understood to mean a metal- or semimetal-containing layer which comprises indium atoms or ions present essentially in oxidic form. In some cases, the indium oxide-containing layer may also comprise proportions of nitrogen (from the reaction), carbon (especially carbene), halogen and/or alkoxide from an incomplete conversion or an incomplete removal of by-products formed. The indium oxide-containing layer may be a pure indium oxide layer, i.e. neglecting any proportions of nitrogen, carbon (especially carbene), alkoxide or halogen consist essentially of indium atoms or ions in oxidic form, or may have proportions of further metals, semimetals or non-metals which may themselves be in elemental or oxidic form. To obtain pure indium oxide layers, it is possible in the process according to the invention to use only indium halogen alkoxides, preferably only one indium halogen alkoxide. In contrast, to obtain other layers comprising metals, semimetals and/or non-metals, as well as the indium halogen alkoxides, it is also possible to use precursors of these elements in the zero oxidation state (to produce layers containing further metals in uncharged form) or oxygen-containing precursors containing the elements in a positive oxidation state (for example other metal alkoxides or metal halogen alkoxides).

Surprisingly, it has also been found that the assumption to date that halogenated precursors inevitably lead to disadvantageous layers is not always valid. For instance, the process according to the invention in which a liquid precursor composition is applied to a substrate and the coating film, before a thermal conversion, is first treated with UV radiation, in the case of use of indium chlorine dialkoxides instead of indium alkoxides, actually results in better layers since they have better electrical properties, more particularly a higher field-effect mobility. In addition, in the case of use of indium halogen dialkoxides instead of indium alkoxides, more amorphous layers are surprisingly also achieved. Amorphous layers possess the advantage of greater homogeneity over a layer composed of single nanocrystals, which is likewise manifested in better electrical properties, especially field-effect mobilities.

The alkyl or alkoxyalkyl radicals R of the indium halogen alkoxides are preferably understood to mean C1- to C15-alkyl or -alkoxyalkyl groups, i.e. alkyl or alkoxyalkyl groups having a total of 1-15 carbon atoms. An alkyl or an alkoxyalkyl radical R is preferably selected from $-CH_3$, $-CH_2CH_3$, $-CH_2CH_2OCH_3$, $-CH(CH_3)_2$ or $-C(CH_3)_3$.

An indium halogen alkoxide may have identical or different R radicals. For the process according to the invention, however, preference is given to using indium halogen alkoxides which have the same alkyl or alkoxyalkyl radical R.

In principle, it is possible to use all halogens in the indium halogen alkoxide. Very particularly good results are achieved, however, when indium chlorine alkoxides are used.

The best results are achieved when the indium halogen alkoxide used is $InCl(OMe)_2$, $InCl(OCH_2CH_2OCH_3)$, $InCl(OEt)_2$, $InCl(OiPr)_2$ or $InCl(OtBu)_2$.

The indium halogen alkoxide $InX(OR)_2$ is preferably used in proportions of 0.1 to 10% by weight, more preferably 0.5 to 6% by weight and most preferably 1 to 5% by weight, based on the total mass of the composition.

The composition comprising the indium halogen alkoxide may comprise it in dissolved form, i.e. in dissociated form or complexed at the molecular level with solvent molecules, or dispersed in the liquid phase.

In the case that only indium-containing precursors are used, the process according to the invention is particularly suitable for production of $In_2O_3$ layers with high quality and good properties. Particularly good layers are the result when the only precursor used is an indium halogen alkoxide.

The composition may, however, as well as the indium halogen alkoxide, also comprise other precursors, preferably alkoxides and halogen alkoxides of other elements, in dissolved or dispersed form. Particular preference is given to alkoxides and halogen alkoxides of B, Al, Ga, Ge, Sn, Pb, P, Zn and Sb. Alkoxides and halogen alkoxides usable very particularly advantageously are the compounds $Ga(OiPr)_3$, $Ga(OtBu)_3$, $Zn(OMe)_2$, $Sn(OtBu)_4$. It is accordingly possible, by using these compounds, to produce indium oxide-containing layers which additionally comprise the elements B, Al, Ga, Ge, Sn, Pb, P, Zn and Sb, or the oxides thereof.

The composition further comprises at least one solvent or dispersion medium. The composition may thus also comprise two or more solvents or dispersion media. To achieve particularly good indium oxide-containing layers, however, only one solvent or dispersion medium should be present in the composition.

Solvents or dispersion media usable with preference are aprotic and weakly protic solvents or dispersion media, i.e. those selected from the group of the aprotic nonpolar solvents/dispersion media, i.e. of the alkanes, substituted alkanes, alkenes, alkynes, aromatics without or with aliphatic or aromatic substituents, halogenated hydrocarbons, tetramethylsilane, the group of the aprotic polar solvent/dispersion media, i.e. of the ethers, aromatic ethers, substituted ethers, esters or acid anhydrides, ketones, tertiary amines, nitromethane, DMF (dimethylformamide), DMSO (dimethyl sulphoxide) or propylene carbonate, and of the weakly protic solvents/dispersion media, i.e. of the alcohols, of the primary and secondary amines and formamide. Solvents and dispersion media usable with particular preference are alcohols, and also toluene, xylene, anisole, mesitylene, n-hexane, n-heptane, tris(3,6-dioxaheptyl)amine (TDA), 2-aminomethyltetrahydrofuran, phenetole, 4-methylanisole, 3-methylanisole, methyl benzoate, butyl acetate, ethyl lactate, methoxyethanol, butoxyethanol, N-methyl-2-pyrrolidone (NMP), tetralin, ethyl benzoate and diethyl ether. Very particularly preferred solvents or dispersion media are methanol, ethanol, isopropanol, tetrahydrofurfuryl alcohol, tert-butanol, butyl acetate, ethyl lactate, methoxyethanol and toluene, and mixtures thereof.

The solvent or dispersion medium is preferably used in proportions of 99.9 to 90% by weight, based on the total mass of the composition.

To achieve particularly good printability, the composition used in the process according to the invention preferably has a viscosity of 1 mPa·s to 10 Pa·s, especially 1 mPa·s to 100 mPa·s, determined to DIN 53019 parts 1 to 2 and measured at 20° C. Corresponding viscosities can be established by adding polymers, cellulose derivatives, or, for example, $SiO_2$ obtainable under the Aerosil trade name, and especially by means of PMMA, polyvinyl alcohol, urethane thickeners or polyacrylate thickeners.

The substrate which is used in the process according to the invention is preferably a substrate consisting of glass, silicon, silicon dioxide, a metal oxide or transition metal oxide, a metal or a polymeric material, especially PI, PEN, PEEK, PC or PET.

The process according to the invention is particularly advantageously a coating process selected from printing processes (especially flexographic/gravure printing, inkjet printing—most preferably continuous, thermal or piezo inkjet printing—, offset printing, digital offset printing and screen printing), spraying processes, rotary coating processes ("spin-coating"), dipping processes ("dip-coating"), and processes selected from meniscus coating, slit coating, slot-die coating, and curtain coating. The process according to the invention is most preferably a printing process. Suitable printing processes are especially inkjet and liquid toner processes (for example HP Indigo), since these processes are particularly suitable for a structured application of the printing material.

After the application of the anhydrous composition to the substrate, it is irradiated with electromagnetic radiation of wavelength ≤360 nm. Particular preference is given to irradiating with light of wavelength 150 to 300 nm.

After the coating and before the conversion, the coated substrate is also preferably dried. Corresponding measures and conditions for this are known to those skilled in the art. The drying differs from the conversion in that it removes the solvent or dispersion medium at temperatures which essentially do not cause any conversion of the material. When the drying is effected by a thermal route, the temperature is not more than 120° C.

The final conversion to an indium oxide-containing layer is effected by a thermal route. The final conversion is preferably effected by means of temperatures of less than 500° C. and greater than 120° C. Particularly good results can, however, be achieved when temperatures of 150° C. to 400° C. are used for the conversion. Methods for attaining these temperatures are based preferably on the utilization of ovens, hot air, hotplates, IR radiators and electron beam radiators.

The conversion times used are typically from a few seconds up to several hours.

The thermal conversion can also be promoted by injecting UV, IR or VIS radiation before, during or after the thermal treatment, or treating the coated substrate with air or oxygen.

The quality of the layer obtained by the process according to the invention can also be improved further by means of a combined thermal and gas treatment (with $H_2$ or $O_2$), plasma treatment (Ar, $N_2$, $O_2$ or $H_2$ plasma), laser treatment (with wavelengths in the UV, VIS or IR range) or an ozone treatment which follows the conversion step.

The coating process can be repeated to increase the thickness. In this case, the coating process can be effected such that each individual application is followed by irradiation and then conversion with electromagnetic radiation, or else there are several applications, each of which is followed by an electromagnetic irradiation, with a single thermal conversion step after the last application.

The invention further provides the indium oxide-containing layers producible via the process according to the invention. Particularly good properties are possessed by indium oxide-containing layers which are producible via the process according to the invention and are pure indium oxide layers. As already stated above, they are produced using only indium-containing precursors, preferably only indium halogen alkoxides, more preferably only one indium halogen alkoxide.

The indium oxide-containing layers producible via the process according to the invention are advantageously suitable for the production of conductive or semiconductive layers for electronic components, especially for the production of transistors (especially thin-film transistors), diodes, sensors or solar cells.

The example which follows is intended to illustrate the subject-matter of the present invention in detail.

EXAMPLE

A doped silicon substrate with an edge length of about 15 mm and with a silicon oxide coating of thickness approx. 200 nm and finger structures composed of ITO/gold was applied with 100 μl of a 2.5% by weight solution of InCl(OMe)$_2$ in ethanol. This is followed by spin-coating at 2000 rpm (5 seconds). Directly after this coating operation, the coated substrate is irradiated with UV radiation in the wavelength range of 150-300 nm originating from a mercury vapour lamp for 5 minutes. Subsequently, the substrate is heated at a temperature of 350° C. on a hotplate for one hour. After the conversion, a value of the field-effect mobility $\mu_{FET}$=5 cm$^2$/Vs at 30 V$_{DS}$ can be determined in a glovebox.

Comparative Example

Indium Alkoxide as Precursor

A doped silicon substrate with an edge length of about 15 mm and with a silicon oxide coating of thickness approx. 200 nm and finger structures composed of ITO/gold was applied with 100 μl of a 2.5% by weight solution of In(OiPr)$_3$ in ethanol. This is followed by spin-coating at 2000 rpm (5 seconds). Directly after this coating operation, the coated substrate is irradiated with UV radiation in the wavelength range of 150-300 nm originating from a mercury vapour lamp for 5 minutes. Subsequently, the substrate is heated at a temperature of 350° C. on a hotplate for one hour. After the conversion, a value of the field-effect mobility $\mu_{FET}$=2.2 cm$^2$/Vs at 30 V$_{DS}$ can be determined in a glovebox.

Comparative Example

Without UV Irradiation

A doped silicon substrate with an edge length of about 15 mm and with a silicon oxide coating of thickness approx. 200 nm and finger structures composed of ITO/gold was applied with 100 μl of a 2.5% by weight solution of InCl(OMe)$_2$ in ethanol. This is followed by spin-coating at 2000 rpm (5 seconds). The coated substrate is heated at a temperature of 350° C. on a hotplate for one hour. After the conversion, a value of the field-effect mobility $\mu_{FET}$=1.7 cm$^2$/Vs at 30 V$_{DS}$ can be determined in a glovebox.

The invention claimed is:

1. A liquid phase process for producing an indium oxide-comprising layer, the process comprising, in an anhydrous atmosphere:
(a) applying an anhydrous composition comprising an indium halogen alkoxide and a solvent or dispersion medium to a substrate, to obtain an intermediate layer;
(b) irradiating the intermediate layer with electromagnetic radiation of wavelength ≤360 nm, to obtain an irradiated layer;
(c) optionally drying the irradiated layer; and
(d) thermally converting the irradiated layer to an indium oxide-comprising layer,
wherein the indium halogen alkoxide in the anhydrous composition has a formula (I):

  (I), wherein:
R is at least one selected from the group consisting of an alkyl radical and an alkoxyalkyl radical; and
X is F, Cl, Br, or I.

2. The process of claim 1, wherein, in formula (I), the alkyl or alkoxyalkyl radical is a C1-C15-alkyl or alkoxyalkyl group.

3. The process of claim 2, wherein the indium halogen alkoxide is InCl(OMe)$_2$, InCl(OCH$_2$CH$_2$OCH$_3$)$_2$, InCl(OEt)$_2$, InCl(OiPr)$_2$, or InCl(OtBu)$_2$.

4. The process of claim 1, wherein the anhydrous composition further comprises at least one selected from the group consisting of an alkoxide and halogen alkoxide of a different element in dissolved or dispersed form.

5. The process of claim 1, wherein a content of the indium halogen alkoxide the anhydrous composition is from 0.1 to 10% by weight, based on a total mass of the anhydrous composition.

6. The process of claim 1, wherein the solvent or dispersion medium is an aprotic or weakly protic solvent or dispersion medium.

7. The process of claim 6, wherein the solvent or dispersion medium is methanol, ethanol, isopropanol, tetrahydrofurfuryl alcohol, tert-butanol, butyl acetate, methoxyethanol, or toluene.

8. The process of claim 1, wherein a content of the solvent or dispersion medium in the anhydrous composition is from 90 to 99.9% by weight, based on a total mass of the anhydrous composition.

9. The process of claim 1, wherein the anhydrous composition has a viscosity of 1 mPa·s to 10 Pa·s.

10. The process of claim 1, wherein the substrate comprises glass, silicon, silicon dioxide, a metal oxide, a transition metal oxide, a metal, or a polymeric material.

11. The process of claim 1, wherein the application of the anhydrous composition is carried out by a printing process, a spraying process, a rotary coating process, a dipping process, or a process selected from the group consisting of meniscus coating, slit coating, slot-die coating, and curtain coating.

12. The process of claim 11, wherein the application is effected via an inkjet printing process selected from the group consisting of continuous inkjet printing, thermal inkjet printing, and piezo inkjet printing.

13. The process of claim 1, wherein the irradiation is carried out with electromagnetic radiation of wavelength 150-300 nm.

14. The process of claim 1, wherein the thermal conversion is effected with temperatures greater than 150° C.

15. The process of claim 1, further comprising before, during, or after (d):
injecting UV, IR, or VIS radiation.

16. An indium oxide-comprising layer obtained by the process of claim 1.

17. A process for producing an electronic component, the process comprising:
forming the indium oxide-comprising layer of claim 16 on an electronic substrate,
wherein the electronic substrate is a transistor, a diode, a sensor, or a solar cell.

18. The process of claim 1, wherein the anhydrous composition further comprises an alkoxide of at least one element selected from group consisting B, Al, Ga, Ge, Sn, Pb, P, Zn, and Sb.

19. The process of claim 1, wherein the anhydrous composition further comprises at least one alkoxide selected from the group consisting of Ga(OiPr)$_3$, Ga(OtBu)$_3$, Zn(OMe)$_2$, Sn(OtBu)$_4$.

20. The process of claim 1, wherein a content of the indium halogen alkoxide in the anhydrous composition is from 0.5 to 6% by weight, based on a total mass of the anhydrous composition.

* * * * *